United States Patent
Wang

(10) Patent No.: US 6,477,045 B1
(45) Date of Patent: Nov. 5, 2002

(54) HEAT DISSIPATER FOR A CENTRAL PROCESSING UNIT

(75) Inventor: Tien-Lai Wang, 2, Ta-Chih Rd., Taoyuan City, Taoyuan Hsien (TW)

(73) Assignees: Tien-Lai Wang, Taoyuan Hsien (TW); Waffer Technology Corp., Taoyuan Hsien (TW)

( * ) Notice: Subject to any disclaimer, the term of this patent is extended or adjusted under 35 U.S.C. 154(b) by 0 days.

(21) Appl. No.: 10/028,447

(22) Filed: Dec. 28, 2001

(51) Int. Cl.[7] .................................................. H05K 7/20
(52) U.S. Cl. ...................... 361/700; 361/695; 361/699; 257/714; 257/715; 174/15.1; 174/15.2; 174/16.3; 165/80.4; 165/104.26
(58) Field of Search .................................. 361/689, 699, 361/695, 698, 700, 702, 703, 704, 707, 709, 711; 257/714, 715, 721, 722; 174/15.1, 15.2; 165/80.3, 80.4, 104.26, 104.33

(56) References Cited

U.S. PATENT DOCUMENTS

| | | | | |
|---|---|---|---|---|
| 5,697,428 A | * | 12/1997 | Akachi | 165/104.14 |
| 5,763,951 A | * | 6/1998 | Hamilton et al. | 257/706 |
| 5,835,345 A | * | 11/1998 | Staskus et al. | 165/80.4 |
| 5,901,037 A | * | 5/1999 | Hamilton et al. | 165/104.33 |
| 6,019,165 A | * | 2/2000 | Batchelder | 165/104.33 |
| 6,269,866 B1 | * | 8/2001 | Yamamoto et al. | 165/104.26 |
| 6,324,058 B1 | * | 11/2001 | Hsiao | 136/203 |
| 6,373,702 B2 | * | 4/2002 | Oishi et al. | 165/185 |
| 6,388,317 B1 | * | 5/2002 | Reese | 257/713 |

* cited by examiner

Primary Examiner—Boris Chervinsky
(74) Attorney, Agent, or Firm—Fei-Fei Chao; Venable, Baetjer, Howard & Civiletti, LLP

(57) ABSTRACT

A heat dissipater for a CPU (Central Processing Unit) includes an upper block and a lower block abutting each other. The upper block has a series of fins extending upward from a first side of the upper block and a recess defined in a second side of the upper block. The lower block includes a first side having a recess defined to correspond to the recess in the upper block and forming a closed chamber with the recess in the upper block and a second side adapted to abut the CPU. Volatile liquid is received in the closed chamber to promote the heat dissipation of the heat dissipater for a CPU.

19 Claims, 11 Drawing Sheets

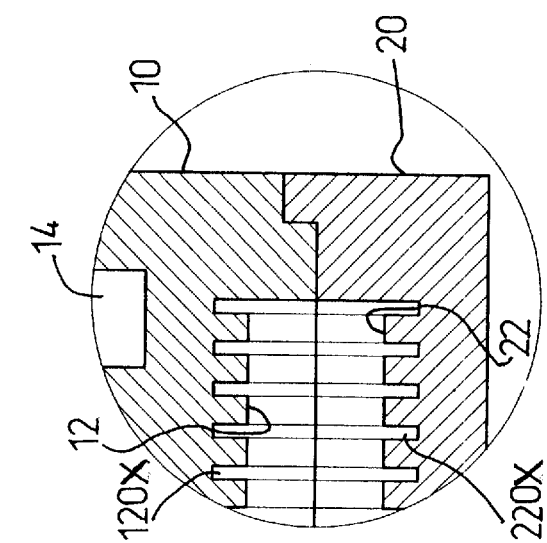
FIG. 4-A
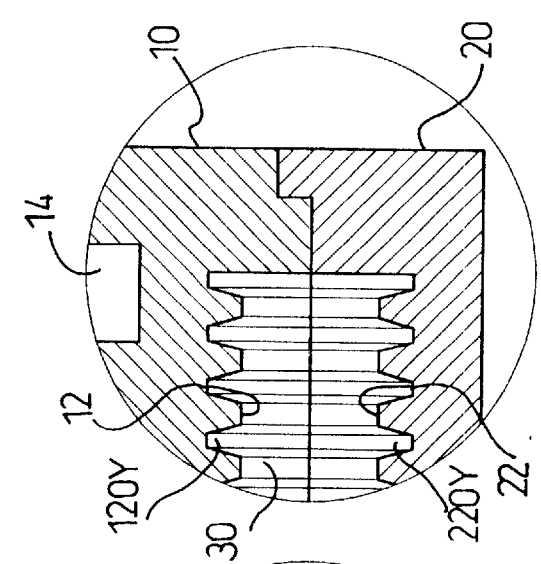
FIG. 4-B
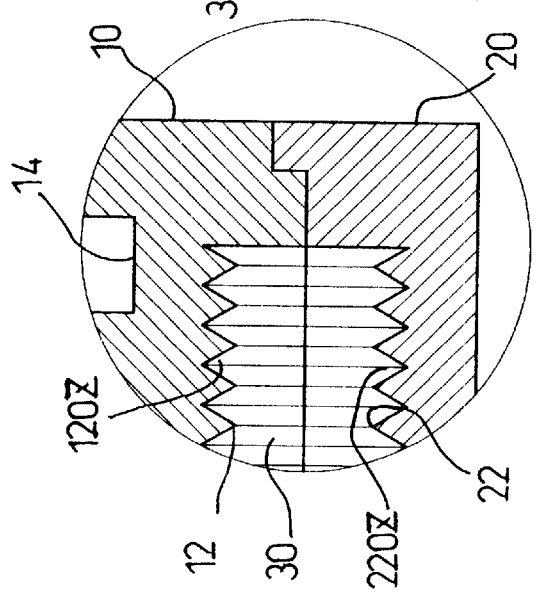
FIG. 4-C

HEAT DISSIPATER FOR A CENTRAL PROCESSING UNIT

BACKGROUND OF THE INVENTION

1. Field of the Invention

The present invention relates to a heat dissipater, and more particularly to a heat dissipater that is adapted to be mounted on a CPU (Central Processing Unit) and includes a chamber corresponding to a cooling fan and containing liquid to promote the dissipation of heat.

2. Description of Related Art

The working temperature of CPUs corresponds to the frequency of the CPU. A high frequency causes a high working temperature. However, a high working temperature damages the electrical and electronic elements of the computer that contain the CPU. Consequently, a heat dissipater for a central processing unit is marketed.

With reference to FIG. 11, a conventional heat dissipater for a central processing unit in accordance with the prior art comprises a plate (60) and multiple fins (62). The plate (60) has a first side adapted to abut a heat source (70), such as a CPU, and a second side having multiple parallel heat dissipating fins (62) extending upward from the second side of the plate (60). A cooling fan (80) is attached to the top of the dissipating fins (62) to promote the dissipation of heat.

However, new CPUs, such as the Pentium 4 manufactured by Intel, operate at a frequency greater than one giga-hertz so that the conventional heat dissipater needs to be altered to dissipate the heat generated by high-frequency CPUs.

The present invention has arisen to mitigate and/or obviate the disadvantages of the conventional heat dissipater for a central processing unit.

SUMMARY OF THE INVENTION

The main objective of the present invention is to provide an improved heat dissipater for a CPU capable of dissipating much more heat with a device fundamentally the same size as the conventional device.

To achieve the main objective, the heat dissipater for a CPU in accordance with the present invention comprises an upper block and a lower block abutting each other. The upper block has a series of fins extending upward from a first side of the upper block and a recess defined in a second side of the upper block. The lower block includes a first side having a recess defined to correspond to the recess in the upper block and forming a closed chamber with the recess in the upper block and a second side adapted to abut the CPU. Volatile liquid fills the close chamber to promote the dissipation of heat by the heat dissipater for a CPU.

Further benefits and advantages of the present invention will become apparent after a careful reading of the detailed description with appropriate reference to the accompanying drawings.

BRIEF DESCRIPTION OF THE DRAWINGS

FIG. 4a is a cross sectional side plan view of a first embodiment of a series of capillary grooves in the heat dissipater in FIG. 1;

FIG. 4b is a cross sectional side plan view of a second embodiment of a series of capillary grooves of the heat dissipater in FIG. 1;

FIG. 4c is a cross sectional side plan view of a third embodiment of a series of capillary grooves of the heat dissipater in FIG. 1;

DETAILED DESCRIPTION OF THE INVENTION

Figure 1:
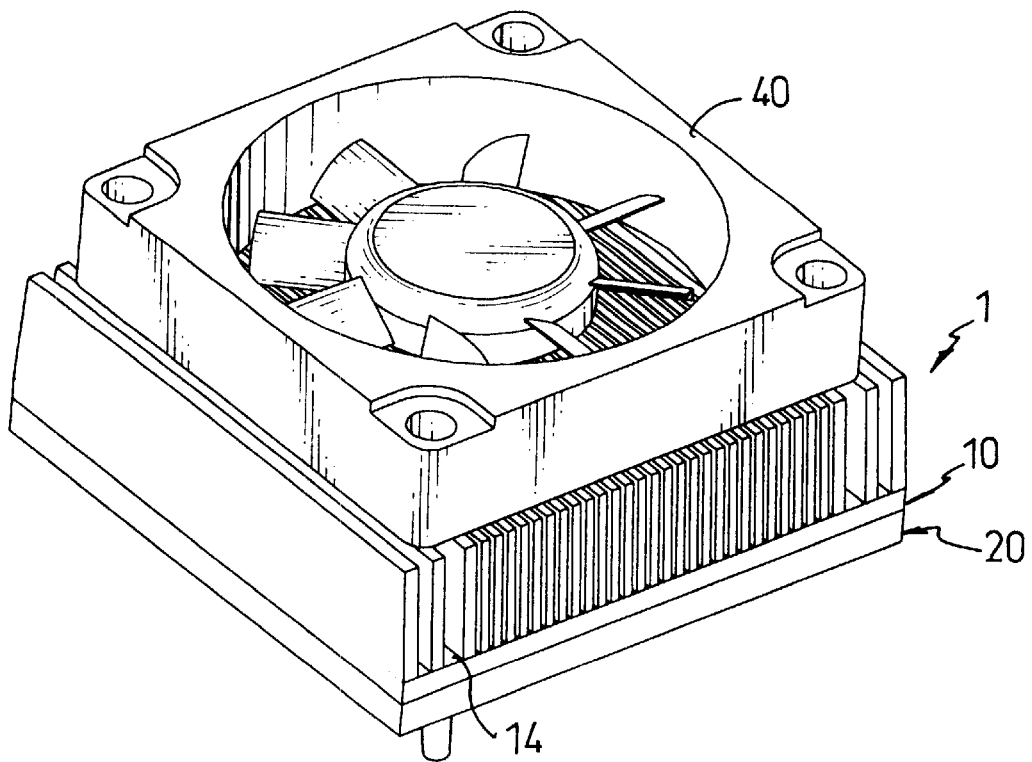
FIG. 1 is a perspective view of a heat dissipater for a CPU in accordance with the present invention.
Figure 2:
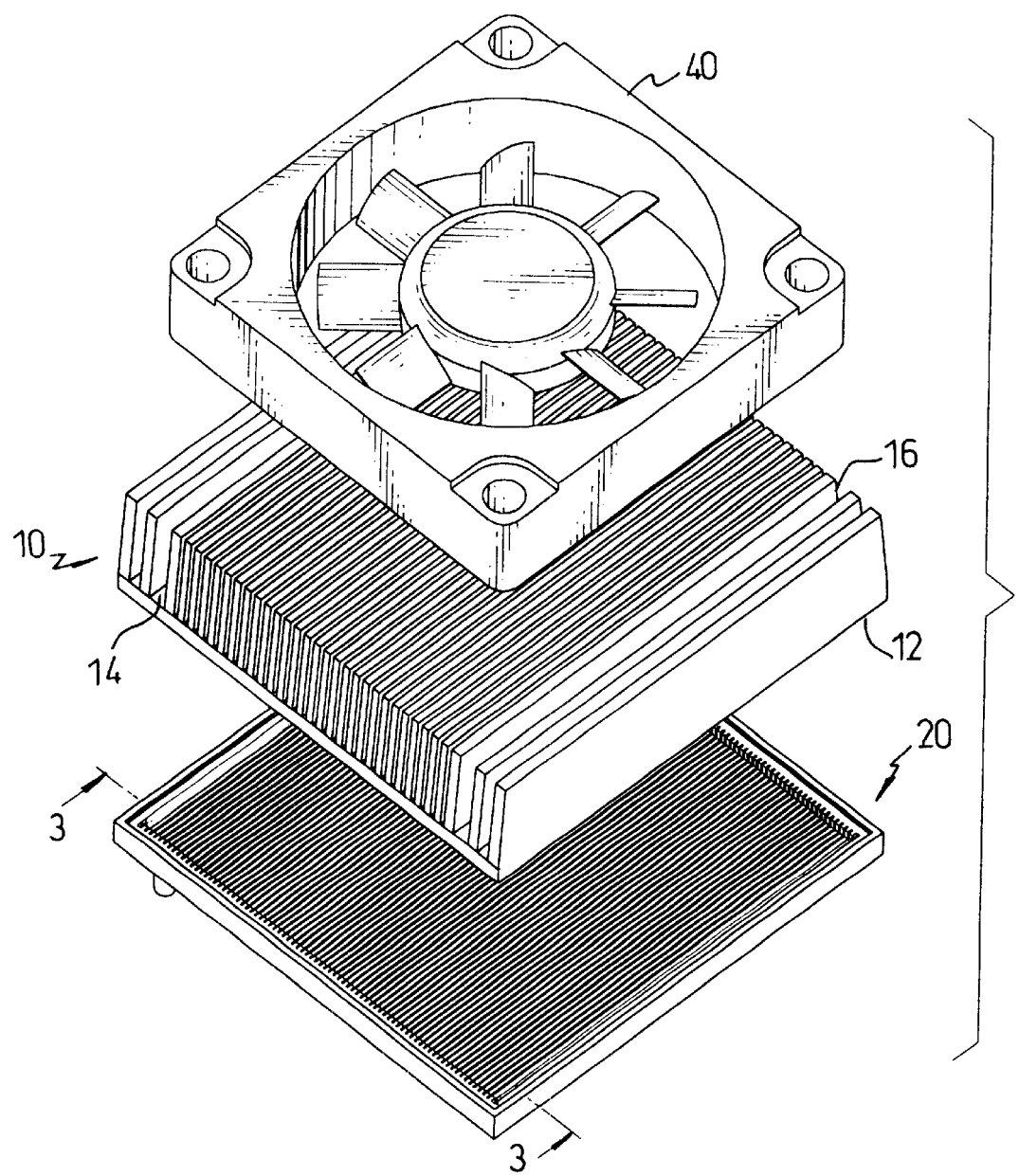
FIG. 2 is an exploded perspective view of the heat dissipater in FIG. 1.
Figure 3:
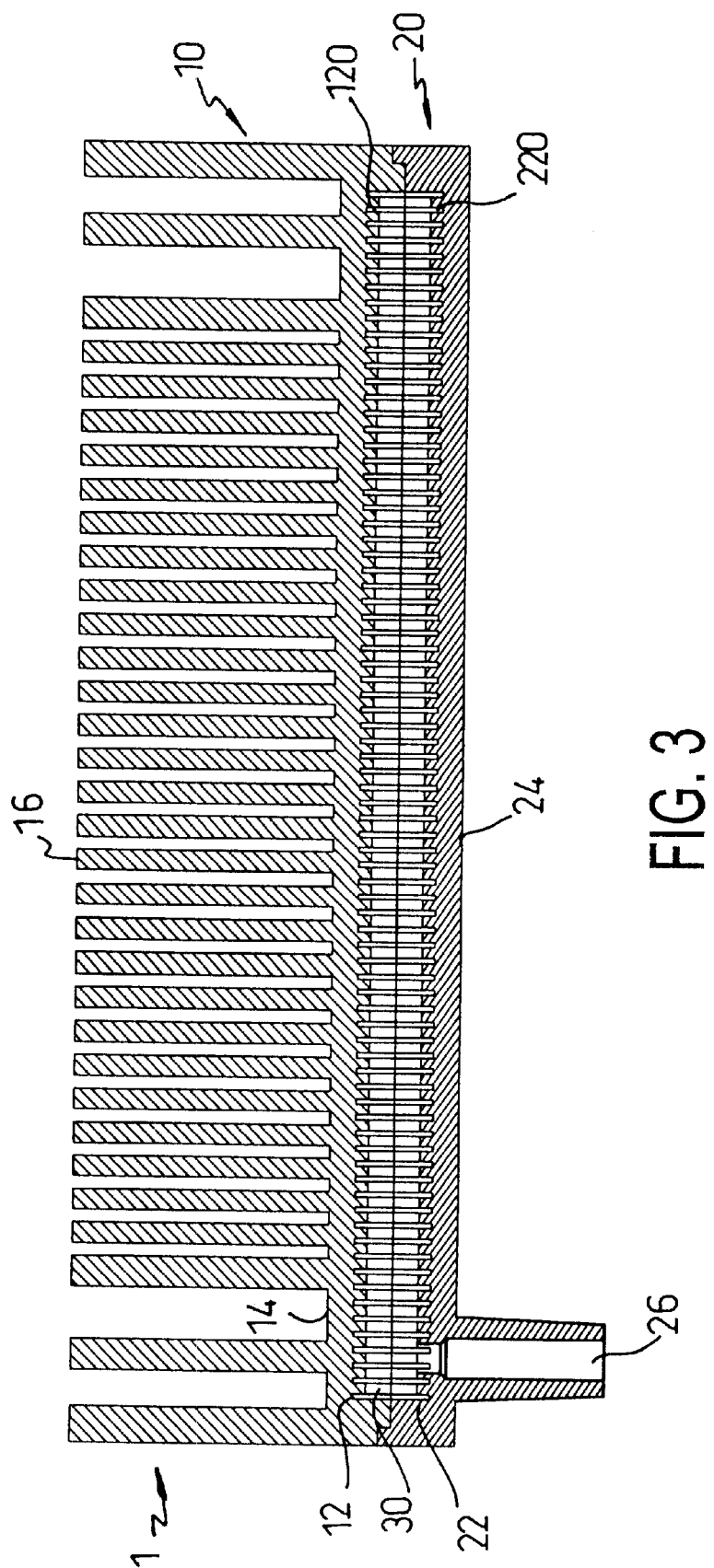
FIG. 3 is a cross sectional side plan view of a lower block of the heat dissipater in FIG. 2 along line 3—3.

With reference to the drawings and initially to FIGS. 1, 2 and 3, a heat dissipater for a CPU in accordance with the present invention comprises an upper block (10), a lower block (20) abutting each other to form a closed chamber (30) between the two blocks (10, 20). The lower block (20) is securely attached to the bottom of the upper block (10) by a method selected from a group consisting of welding, ultrasonic wave welding or gluing. The methods for manufacturing the upper block (10) and the lower block (20) are die casting or semi-solid injection molding.

The upper block (10) comprises a series of fins (16) extending upward from a first side (14) of the upper block (10) and a recess (12) defined in a second side of the upper block (10). The upper block (10) is made of a good thermal conductive material, such as copper, magnesium, aluminum or an alloy of the above materials and the fins (16) integrally extend from the upper block (10). The series of fins (16) are parallel to one another and the topmost of the fins (16) is adapted to mount a cooling fan (40) on the upper block (10). A series of parallel capillary grooves (120) is defined in a periphery of the recess (12) of the upper block (10).

The lower block (20) is made of a good thermal conductive material, such as copper, magnesium, aluminum or an alloy of the above materials. The lower block (20) comprises a recess (22) defined in a first side of the lower block (20) and corresponding to the recess (12) in the upper block (10). The two recesses (12, 22) of the two blocks (10, 20) define the chamber (30) when the two blocks (10, 20) are securely attached to each other. A series of parallel capillary grooves (220) are defined in a periphery of the recess (22) of the lower block (20). Each capillary groove (220) in the lower block (20) aligns and communicates with a corresponding one of the capillary grooves (120) in the upper block (10). An inlet (26) is defined in the lower block (20) and communicates with the chamber (30) to allow the chamber (30) to be partially filled with liquid. The liquid is volatile, such as pure water, methanol, toluene, coolant or the like.

The closed chamber (30) is drawn to be vacuum via the inlet (26). Then volatile liquid, such as pure water, methanol, toluene, coolant or the like, is charged into the vacuum close chamber (30). The inlet (26) is sealed as the adequate liquid is charged into. Creating a vacuum in the chamber (30) is to prevent the non-condensable gas and contamination in the air from staying in the chamber (30). It will have an adverse influence on the performance of dissipating heat. The other reason to vacuum is that the operating temperature is often lower than the vaporized temperature at atmospheric pressure. The volume of volatile liquid depends on the operating temperature and dissipating heat flux that you intend.

Heat from heat source, such as CPU, thermally conducts through the lower block (20) then, conducts through the volatile liquid filled evaporator capillaries thereby heating the volatile liquid until it vaporizes at the designed operating temperature then, the high temperature (thus high pressure) vapor flow adiabatically (without heat loss or gain) toward the far end which is in lower temperature (thus low pressure). Then the heated vapor condenses and gives up its latent heat of vaporization due to fanned air current guided by fins (16). The condensed volatile liquid returns to the evaporator through the capillaries of the upper and lower blocks (10, 20).

The cross sectional shape of the capillary groove (120, 220) can be several types. With reference to FIG. 4-A, the cross sectional shape of the capillary groove (120X,220X) is rectangular. With reference to FIG. 4-B, the cross sectional shape of the capillary groove (120Y/220Y) is trapezoid. With reference to FIG. 4-C, the cross sectional shape of the capillary groove (120Z/220Z) is triangle.

Figure 5:
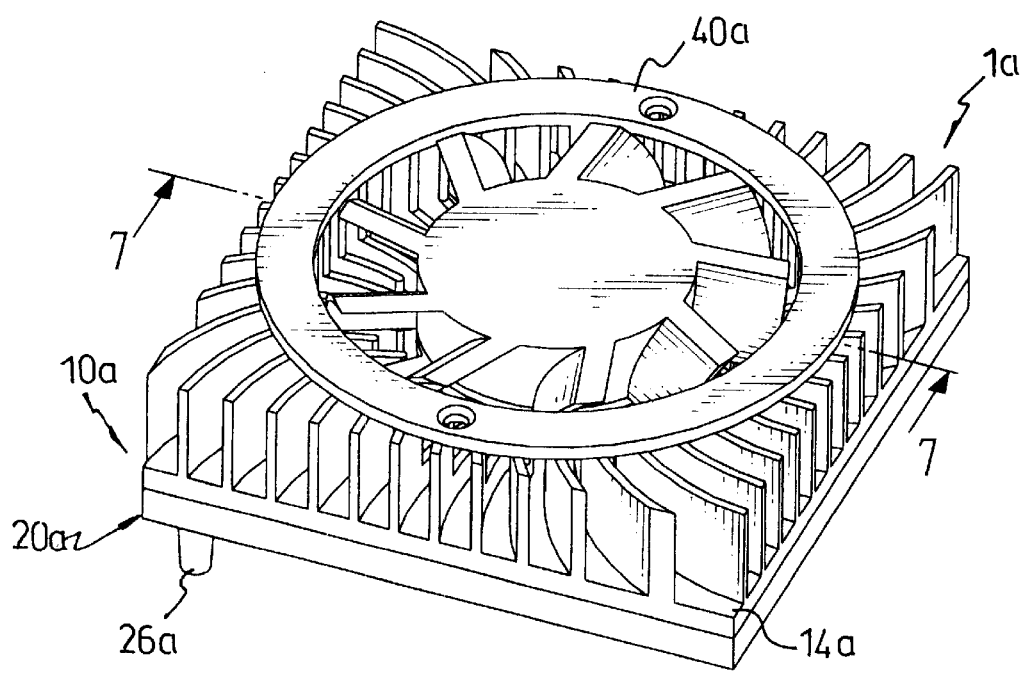
FIG. 5 is a perspective view of a second embodiment of a heat dissipater for a CPU in accordance with the present invention.
Figure 6:
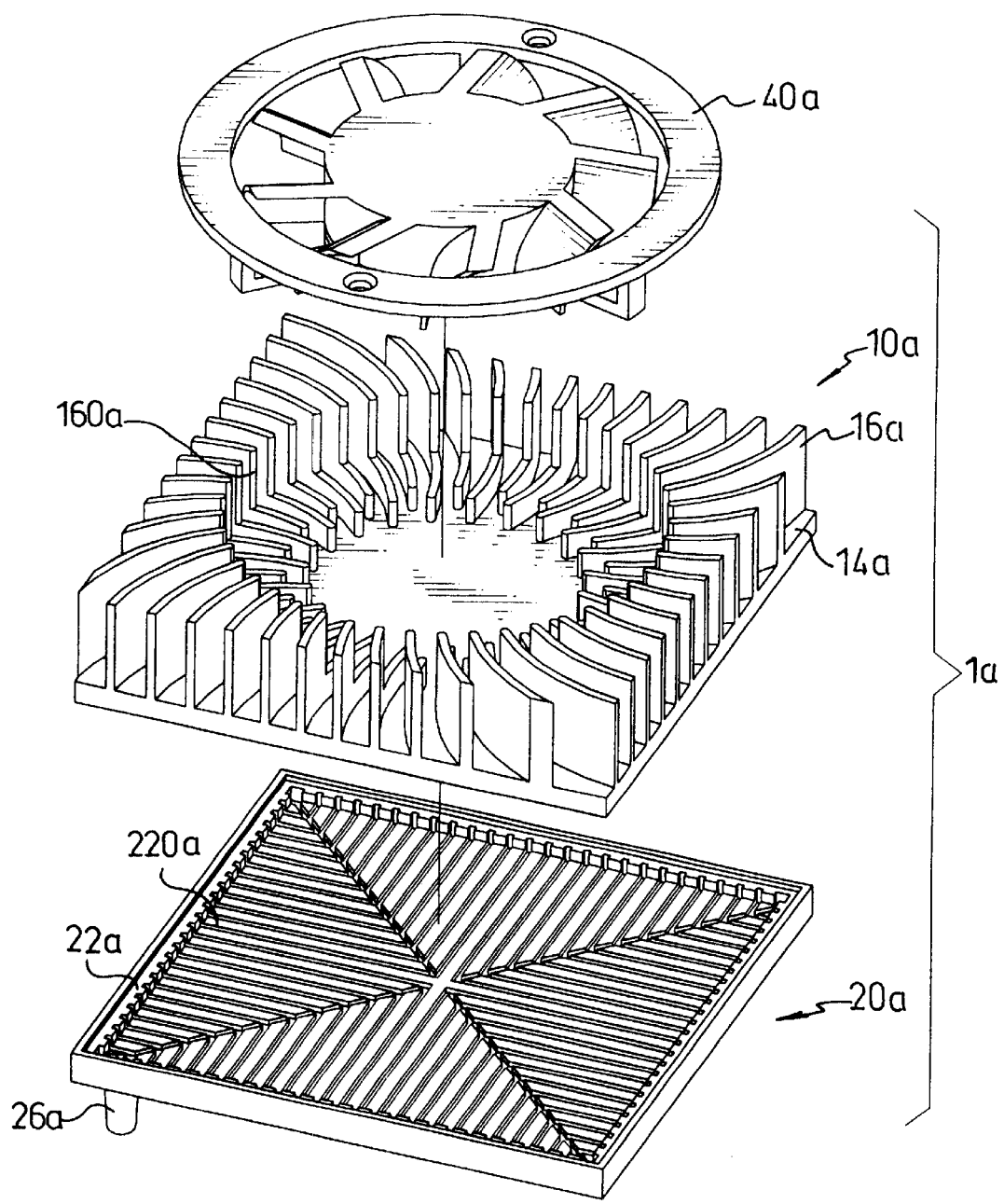
FIG. 6 is an exploded perspective view of the heat dissipater in FIG. 5.
Figure 7:
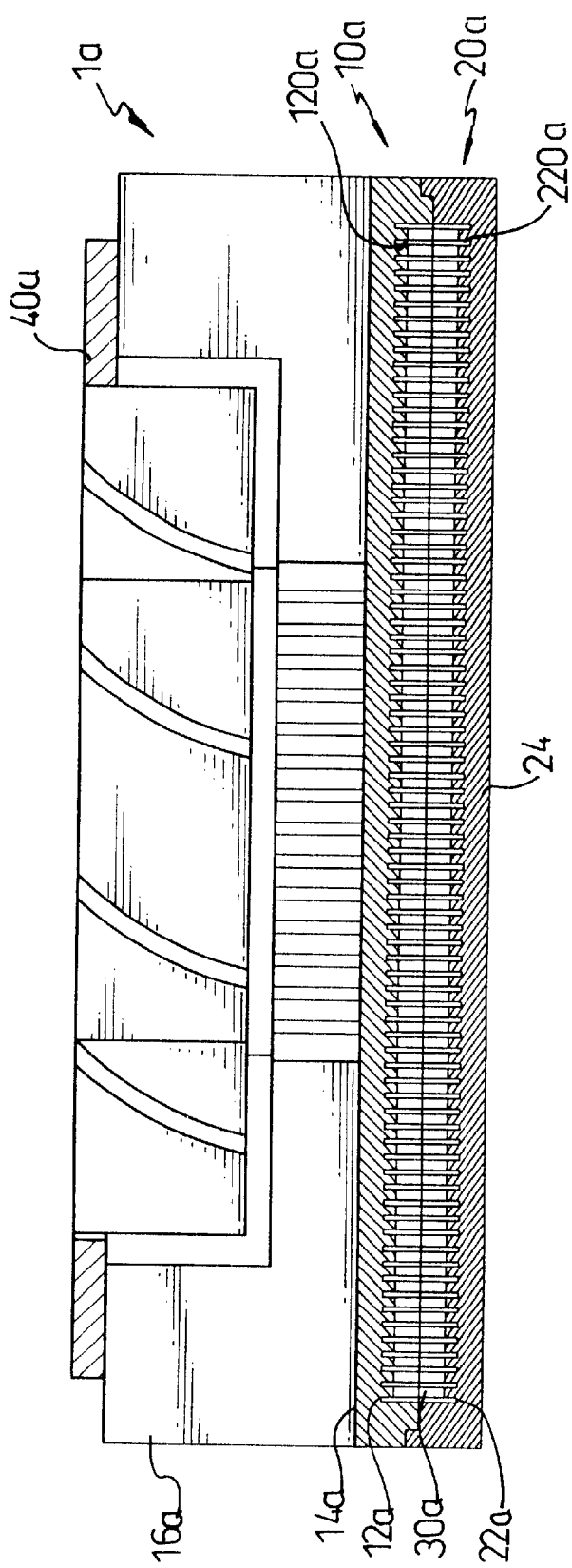
FIG. 7 is a cross sectional side plan view of the heat dissipater in FIG. 5 along line 7—7.

With reference to FIGS. 5–7, a second embodiment of the heat dissipater for a CPU in accordance with the present invention comprises an upper block (10a), a lower block (20a) and a fan (40a). The upper block (10a) includes multiple fins (16a) extending upwardly from the first side (14a) of the upper block (10a). Each fin (16a) is directed toward the center of the upper block (10a) and has a cutout (not numbered) near the center of the upper block (10a) to form a receiving space (160a) to accommodate the cooling fan (40a) in the upper block (10a).

Figure 8:
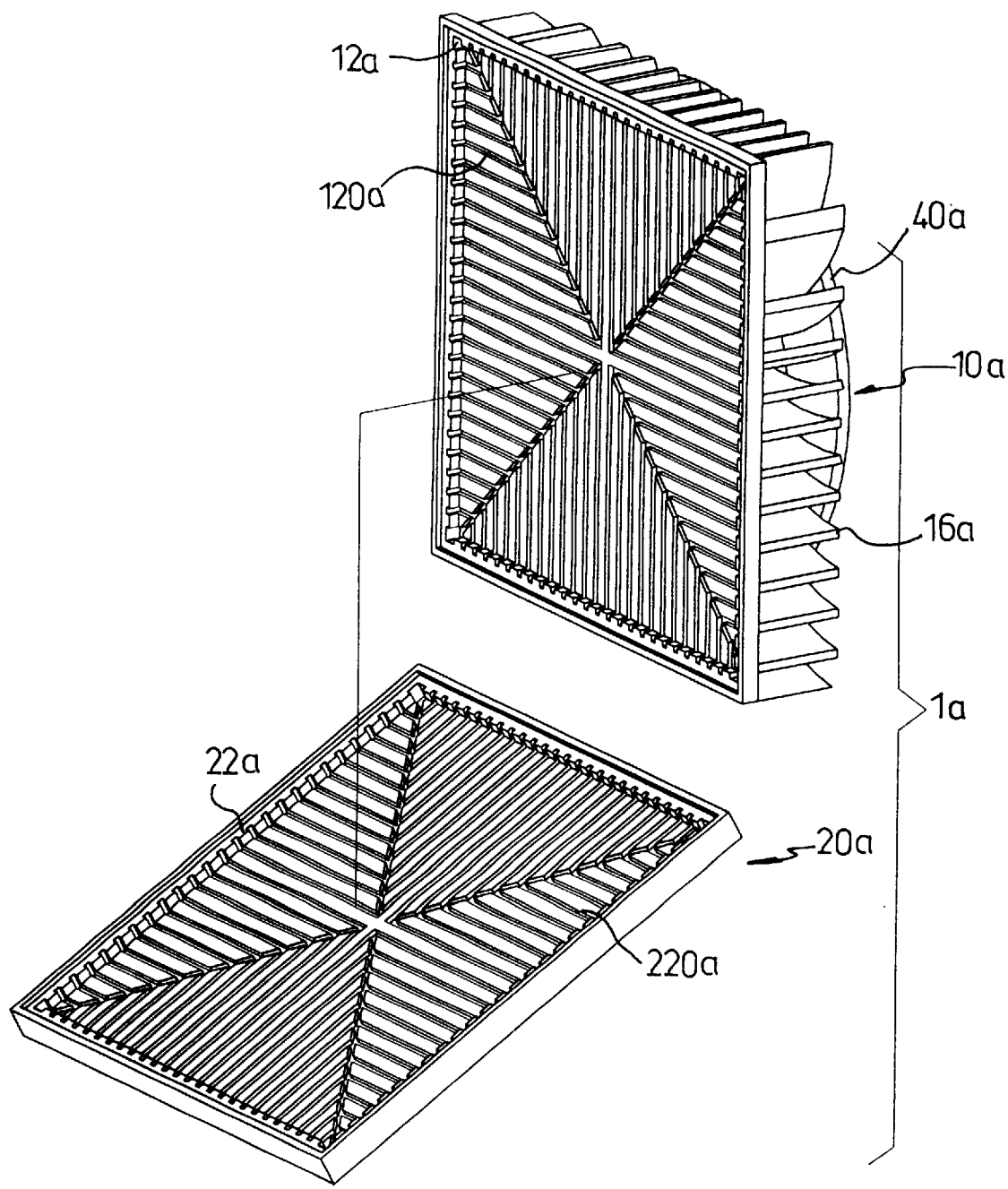
FIG. 8 is a partially exploded view of the heat dissipater in FIG. 5 showing a series of capillary grooves in the second embodiment of the present invention.

With reference to FIGS. 6 and 8, the recesses (12a, 22a) in the upper and lower blocks (10a, 20a) are respectively divided into four isosceles triangles each having an apex at the center of the upper and the lower blocks (10a, 20a). The capillary grooves (120a, 220a) of opposite triangles are parallel to each other, and the capillary grooves (120a, 220a) of adjacent triangles communicates with each other. The capillary grooves (120a) in the upper block (10a) align with the corresponding capillary grooves (220a) in the lower block (20a).

Figure 9:
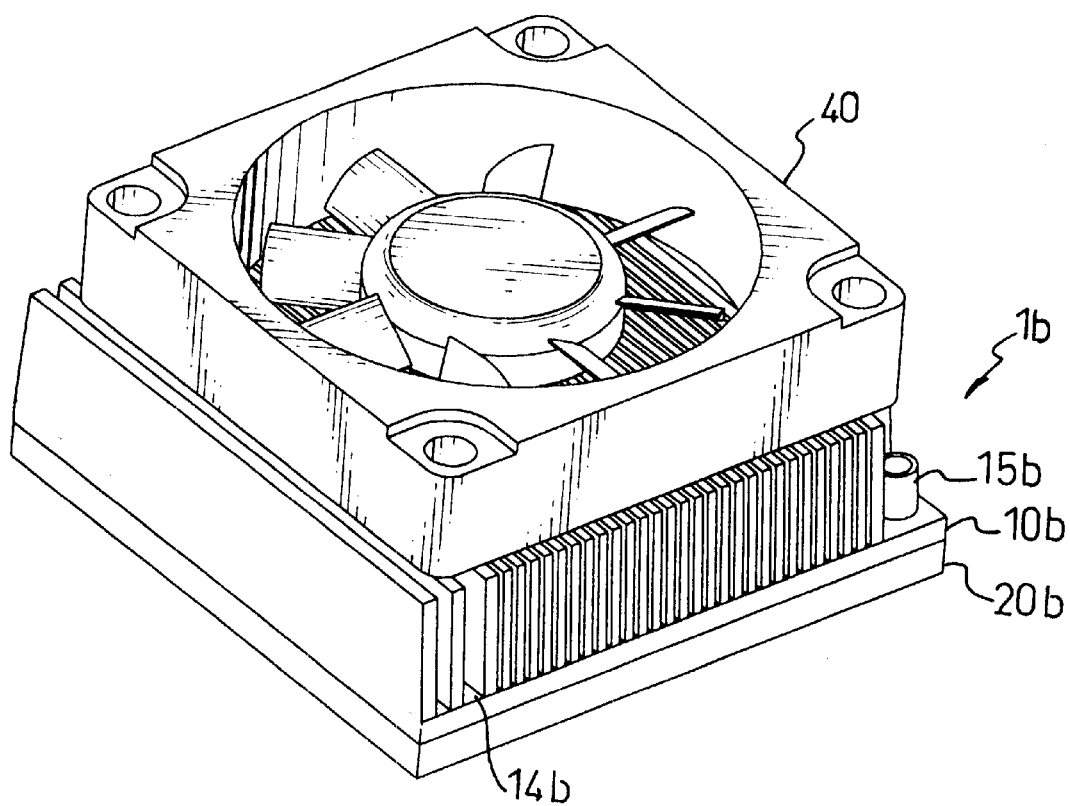
FIG. 9 is a perspective view of a third embodiment of a heat dissipater for a CPU in accordance with the present invention.

With reference to FIG. 9, a third embodiment of the heat dissipater for a CPU in accordance with the present invention has an inlet (15b) formed on the upper block (10b) that communicates with the chamber (30) defined by the recesses (12, 13) of the upper block (10b) and the lower block (20b).

Figure 10:
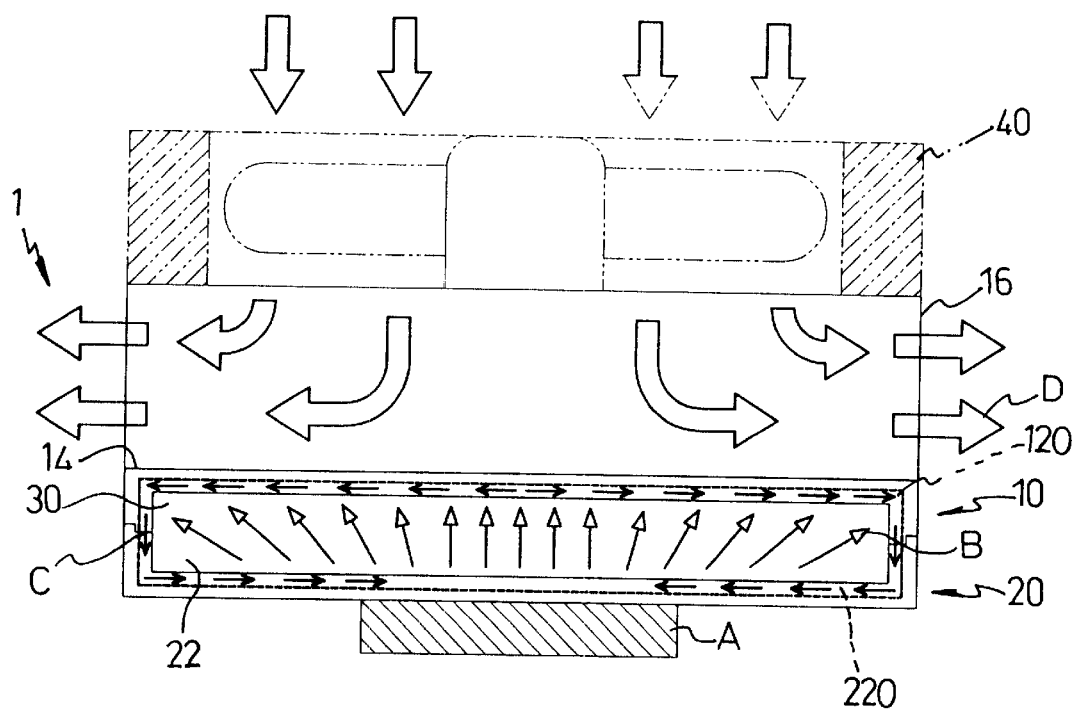
FIG. 10 a schematic side view of the heat dissipater in accordance with the pressure invention showing the air flow and dissipation of heat.
Figure 11:
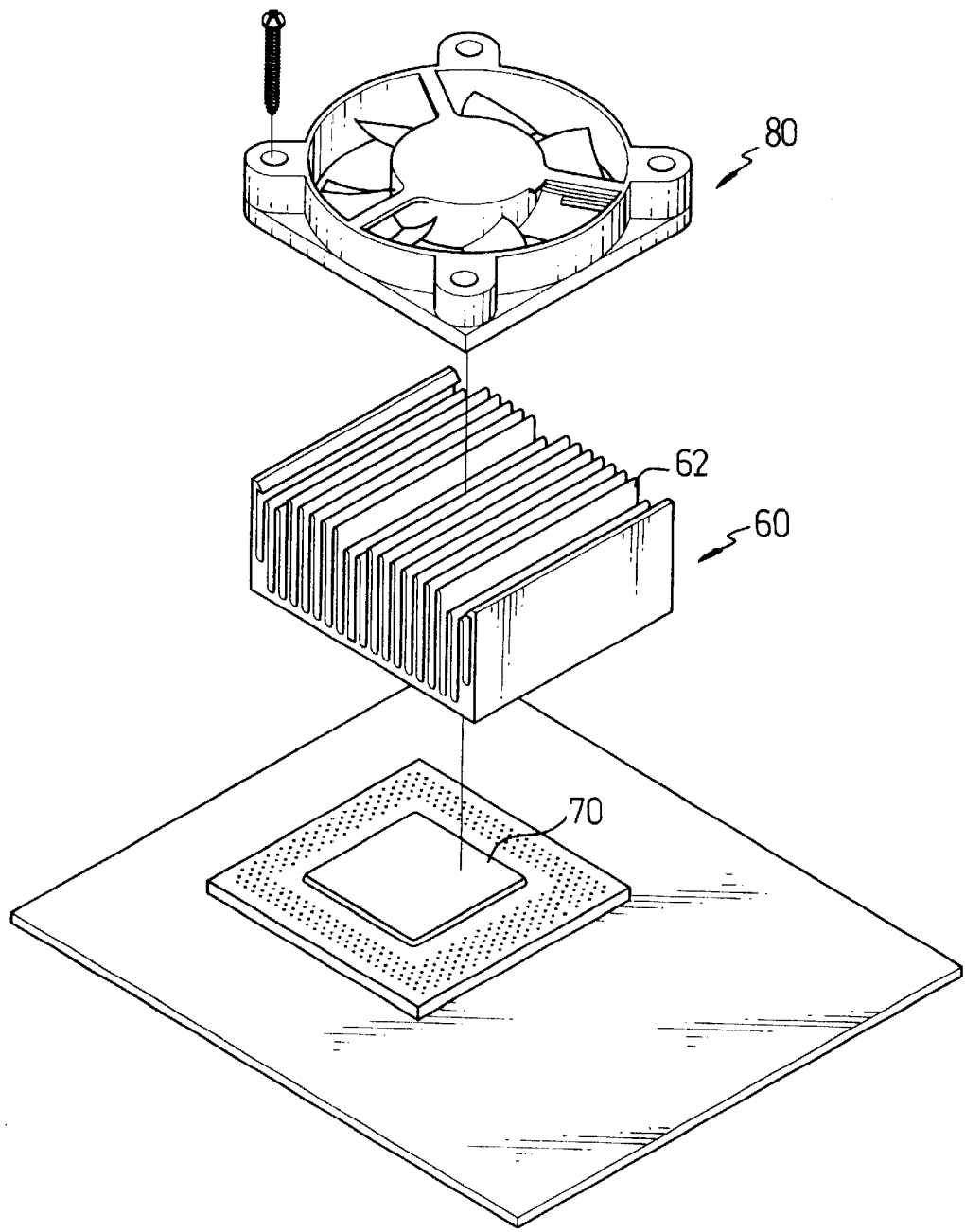
FIG. 11 is an exploded perspective view of a conventional heat dissipater for a CPU in accordance with the prior art.

With reference to FIG. 10, in use the bottom of the lower block (20) the heat dissipater abuts a heat source (A), such as a CPU. The vapor-liquid balance in the chamber (30) changes when the CPU operates and raises the temperature. The liquid in the chamber (30) is vaporized due to the increased temperature caused by the CPU, and the vapor (B) from the liquid completely fills the chamber (30). The liquid vapor (B) condenses in the capillary grooves (120) in the upper block (10) because the cooling fan (40) generates an air current (D) that blows on the first side (14) of the upper block (10) to reduce the temperature of the upper block (10) and the lower block (20). The condensed vapor (C) flows into the recess (22) in the lower block (20) along the capillary grooves (120, 220) in the upper and lower blocks (10, 20). The liquid is vaporized again after flowing into the recess (22) in the lower block (20). By such an arrangement and vapor-liquid circulation, the temperature of the CPU is effectively reduced by the heat dissipater in accordance with the present invention when the CPU is operating.

The liquid in the chamber (30) absorbs the heat generated by a working CPU to reduce the temperature of the working CPU. Consequently, the heat dissipation of the heat dissipater in accordance with the present invention is more effective than that of the conventional heat dissipater. A lower working temperature effectively lengthens the useful life of the electrical and electronic elements.

Although the invention has been explained in relation to its preferred embodiment, it is to be understood that many other possible modifications and variations can be made without departing from the spirit and scope of the invention as hereinafter claimed.

What is claimed is:

1. A heat dissipater for a CPU (central processing unit) comprising:

an upper block and a lower block being integrally formed and made of a heat conductive material, the upper block including:
a series of fins extending from a first end of the upper block and adapted to mount a cooling fan on the upper block;
a first recess defined in a second side of the upper block; and
a series of first capillary grooves defined in a periphery of the first recess in the upper block;

the lower block securely attached to the second side of the upper block, the lower block having a first side facing the upper block and a second side adapted to abut the CPU, the lower block including;
a second recess defined in the first side of the lower block, the second recess corresponding to the first recess in the upper block and defining a closed chamber with the first recess in the upper block after the lower block being securely attached to the second side of the upper block; and
a series of second capillary grooves defined in a periphery of the second recess in the lower block, each second capillary groove aligning with and communicating with a corresponding one of the series of first capillary grooves; and
volatile liquid received in chamber, the liquid having a volume smaller than that of the chamber, the volatile liquid vaporizes when a temperature of a working environment is raised;
wherein a vacuum is drawn on the chamber to remove residual vapor and foreign articles from the chamber before the volatile liquid is drawn into the chamber.

2. The heat dissipator as claimed in claim 1, wherein the upper and lower blocks are die castings.

3. The heat dissipator as claimed in claim 1, wherein the upper and lower blocks is are molds.

4. The heat dissipator as claimed in claim 1, wherein the first and second grooves correspond to and communicate with each other.

5. The heat dissipater for a CPU as claimed in claim 4, wherein the first and second capillary grooves each has a rectangular cross sectional shape.

6. The heat dissipater for a CPU as claimed in claim 4, wherein the first and second capillary grooves each has a trapezoidal cross sectional shape.

7. The heat dissipater for a CPU as claimed in claim 4, wherein the first and second capillary grooves each has triangular cross sectional shape.

8. The heat dissipator for a CPU as claimed in claim 2, wherein the material is selected from a group consisting of copper, aluminum, magnesium or the alloy thereof.

9. The heat dissipator for a CPU as claimed in claim 1, wherein the volatile liquid is selected from a group consisting of pure water, methylbenzene, methanol or coolant.

10. The heat dissipator for a CPU as claimed in claim 1, wherein the upper block and the lower block are welded or glued to each other.

11. The heat dissipater for a CPU as claimed in claim 1, wherein the series of fins extend upward from the first side of the upper block parallel to one another.

12. The heat dissipater for a CPU as claimed in claim 1, wherein the series of fins extend upward from the first side of the upper block, each fin directed to a center of the upper block, each dissipating plate having a cutout defined near the center of the upper block to form a receiving space adapted to receive the cooling fan.

13. The heat dissipater for a CPU as claimed in claim 11, wherein the series of capillary grooves of the upper block and the lower block each has a rectangular cross sectional shape.

14. The heat dissipater for a CPU as claimed in claim 11, wherein the series of capillary grooves of the upper block and the lower block each has a trapezoidal sectional shape.

15. The heat dissipater for a CPU as claimed in claim 11, wherein the series of capillary grooves of the upper block and the lower block each has triangular cross sectional shape.

16. The heat dissipater for a CPU as claimed in claim 12, wherein the recess of the upper block is divided into four isosceles triangles each having an apex at the center of the upper block and the recess of the lower block is divided into four isosceles each having an apex at a center of the lower block, the four isosceles triangles adjacent to one another and separate triangles opposite to each other, the capillary grooves of two opposite isosceles triangles parallel to one another and the capillary grooves of adjacent triangles communicating with each other.

17. The heat dissipater for a CPU as claimed in claim 16, wherein the series of capillary grooves of the upper block and the lower block each has a rectangular cross sectional shape.

18. The heat dissipater for a CPU as claimed in claim 16, wherein the series of capillary grooves of the upper block and the lower block each has a trapezoidal cross sectional shape.

19. The heat dissipater for a CPU as claimed in claim 16, wherein the series of capillary grooves of the upper block and the lower block each has triangular cross sectional shape.

* * * * *